United States Patent
Chang

(10) Patent No.: US 7,838,427 B2
(45) Date of Patent: Nov. 23, 2010

(54) METHOD FOR PLANARIZATION

(75) Inventor: Yuh-Hwa Chang, Shulin (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 363 days.

(21) Appl. No.: 11/332,085

(22) Filed: Jan. 13, 2006

(65) Prior Publication Data

US 2007/0167018 A1    Jul. 19, 2007

(51) Int. Cl.
    *H01L 21/311* (2006.01)
(52) U.S. Cl. ............... 438/697; 438/698; 257/E21.246
(58) Field of Classification Search ......... 438/697–698; 257/E21.246
    See application file for complete search history.

(56) References Cited

U.S. PATENT DOCUMENTS

| | | | | |
|---|---|---|---|---|
| 4,721,548 A | * | 1/1988 | Morimoto | 438/697 |
| 5,139,608 A | * | 8/1992 | Grivna | 438/697 |
| 5,173,448 A | * | 12/1992 | Yanagi | 438/699 |
| 5,332,687 A | * | 7/1994 | Kuroda | 438/241 |
| 5,885,900 A | * | 3/1999 | Schwartz | 438/697 |
| 6,025,270 A | * | 2/2000 | Yoo | 438/697 |
| 6,281,112 B1 | * | 8/2001 | Sugiyama | 438/624 |
| 6,432,827 B1 | * | 8/2002 | Chien et al. | 257/E21.246 |
| 6,617,241 B1 | * | 9/2003 | Doan | 438/697 |

OTHER PUBLICATIONS

Quirk et al., Semiconductor Manufacturing Technology, Prentice-Hall, Upper Saddle River, New Jersey, 2001, pp. 519.*

* cited by examiner

*Primary Examiner*—W. David Coleman
*Assistant Examiner*—Sun M Kim
(74) *Attorney, Agent, or Firm*—Tung & Associates

(57) ABSTRACT

A method of planarizing a dielectric insulating layer including providing a substrate including forming a first dielectric insulating layer having a concave and convex portion on the substrate; forming an organic resinous layer on the first dielectric insulating layer and exposing the convex portion of the first dielectric insulating layer; isotropically etching the first dielectric insulating layer convex portion; removing the organic resinous layer; and, forming a second dielectric insulating layer on the first dielectric insulating layer.

20 Claims, 4 Drawing Sheets

METHOD FOR PLANARIZATION

FIELD OF THE INVENTION

This invention generally relates to large scale integrated circuit manufacturing methods and more particularly to a method for planarizing relatively large step heights in dielectric insulating layers including PMD layers.

BACKGROUND OF THE INVENTION

Etching of openings for forming electrical interconnects in the semiconductor processing industry is becoming more demanding as device sizes shrink. For example, as device sizes shrink to 0.15 microns and below, the location and etching profiles of electrical contact holes is increasingly important to avoid overetching and misalignment which can cause electrical shorting thereby reducing device yield as well as reliability.

Undesired step heights produced by conformal or blanket deposition of dielectric insulating layers is particularly an issue in depositing pre-metal dielectric (PMD) layers over semiconductor devices formed on a semiconductor substrate. For example, planarization of the PMD layer is important to accurately and reliably form contacts to electrically connect the device to subsequently formed overlying levels of wiring. For example, step heights or topography variations of the PMD layer following deposition can be as high as 1 micron or more. Consequently, chemical mechanical polish (CMP) processes are not favored for planarization due to the large amount of material which must be removed by CMP to achieve a desired degree of planarization, thereby increasing processing cost.

Prior art approaches have proposed used dry etchback processes in PMD planarization processes. While this approach is generally effective for small variations in topography, etchback approaches for larger variations in topography (step heights) may not be adequately planarized the PMD layer, due to preferential or overetching during the etchback process leading to depressed areas which create problems in subsequent formation of contact holes including backfilling with metal.

There is therefore a continuing need in the integrated circuit manufacturing art for improved and cost effective planarization methods to increase device yield and reliability.

It is therefore an object of the invention to provide an improved and cost effective planarization method to increase device yield and reliability, as well as overcoming other shortcomings in the prior art.

SUMMARY OF THE INVENTION

To achieve the foregoing and other objects, and in accordance with the purposes of the present invention, as embodied and broadly described herein, the present invention provides a method of planarizing a dielectric insulating layer.

In a first embodiment, the method includes providing a substrate; forming a first dielectric insulating layer having a concave and convex portion on the substrate; forming an organic resinous layer on the first dielectric insulating layer and exposing the convex portion of the first dielectric insulating layer; isotropically etching the first dielectric insulating layer convex portion; removing the organic resinous layer; and, forming a second dielectric insulating layer on the first dielectric insulating layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to and is particularly advantageously implemented in forming a pre-metal dielectric (PMD) insulating layer having a topography step height of greater than about 0.5 microns including about 1 micron or larger, it will be appreciated that the method of the present invention may be applied for the planarization of any dielectric insulating layer having a glass transition temperature and where the formation of metal stringers in subsequent processing steps in depressed surface is advantageously be avoided.

Figure 1A:
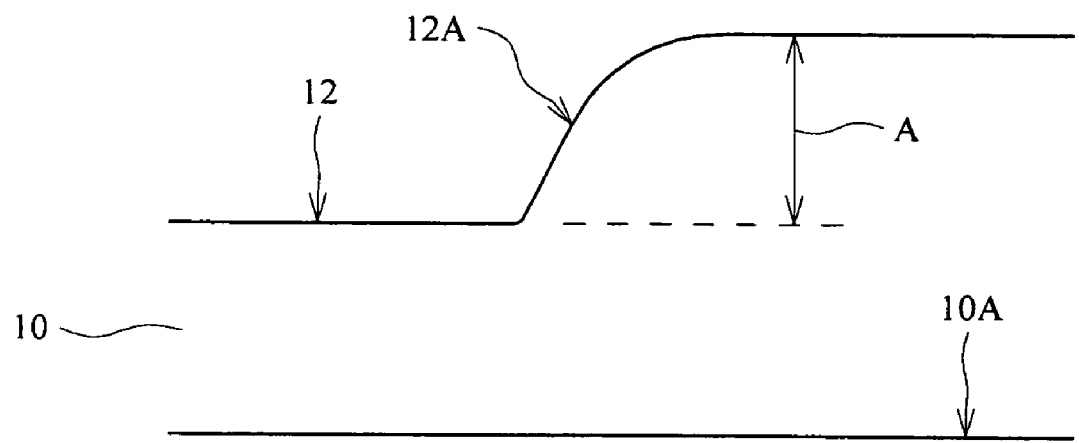
FIGS. 1A-1F are cross sectional side views of a portion of an exemplary dielectric insulating layer showing manufacturing stages according to an embodiment of the present invention.

In an exemplary embodiment of the present invention, reference is made to FIGS. 1A-1F where cross sectional side views of a portion of a semiconductor process wafer is shown at stages in a planarization process according to embodiments of the present invention. For example, referring to FIG. 1A is shown a topography surface 12 of a dielectric insulating layer 10. For example, the dielectric insulating layer 10, for example, is a PMD layer formed over a substrate surface 10A, for example a semiconductor wafer substrate surface having CMOS devices (not shown) formed on the substrate surface and including a contact etching stop layer e.g., SiN. For example the PMD layer 10 is formed at a thickness of about 0.5 microns to about 2 microns in thickness, more preferably from about 0.5 microns to about 1.5 microns. Step height portion 12A of PMD surface 12 is shown following PMD deposition and having a step height e.g., A, for example, about equal to the thickness of the PMD layer, for example about 1 micron.

Preferably, the PMD layer 10 is formed of flowable silicon oxide based material having a glass transition temperature, for example phosphosilicate glass (PSG), borophosphosilicate glass (BPSG), BPTEOS, or combinations thereof, most preferably BPSG due to an enhanced ability to flow at lower temperatures thereby avoiding lateral diffusion of previously doped substrate regions such as LDD and source and drain regions. For example, the BPSG is preferably formed by an APCVD, LPCVD, PECVD reaction, including silane precursors or TEOS/$O_3$ (to form BPTEOS) as well as dopant precursors such as trimethyl borate (TMB) and trimethyl phosphate (TMP). For example, the BPSG layer 10 is formed having a wt % of dopants e.g., boron and phosphorus at about 3 wt % to about 5 wt %.

Figure 1B:
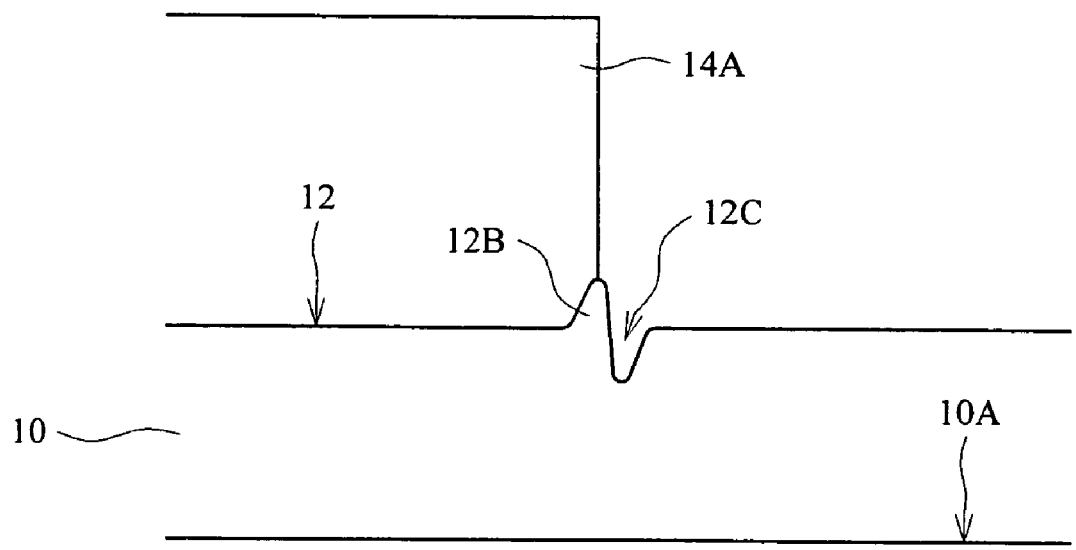

Referring to FIG. 1B, a photoresist layer is then applied and patterned to form photoresist layer mask portion 14A exposing at least a portion of the step height portion 12A, followed by a conventional fluorocarbon chemistry oxide dry etchback process according to a timed process to partially planarize the PMD layer surface including step height portion 12A to a planarization level e.g., be about equal with surface portion 12. For example, in patterning to expose the step height portion 12A, some misalignment typically occurs where a portion of the step height portion 12A e.g., is covered by the photoresist layer 14A and remains to leave protruding portion e.g., 12B (convex portion) of PMD layer 10 following the dry etchback process. In addition, following the etchback process, a notched or preferentially etched area (depression) 12C (concave portion) may be formed adjacent the protruding portion 12B.

Figure 1C:
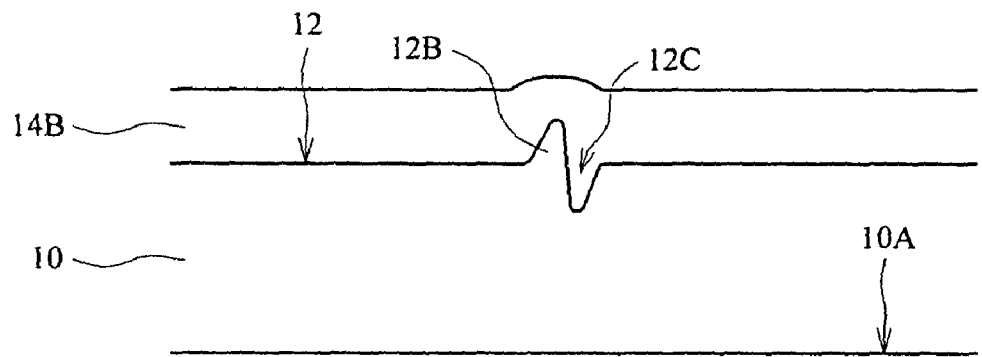

Referring to FIG. 1C, the photoresist mask 14A is first stripped, for example by a wet or dry etchback process, followed by forming a second overlying photoresist layer 14B preferably having a thickness less than the first photoresist layer 14A, for example having a thickness sufficient to cover the protruding portions of the topography above-surface 12, for example portion 12B. Since the second photoresist layer 14B is not photolithographically patterned, a conventional non-photoactive organic resinous layer may be used in place of a photoresist.

Figure 1D:
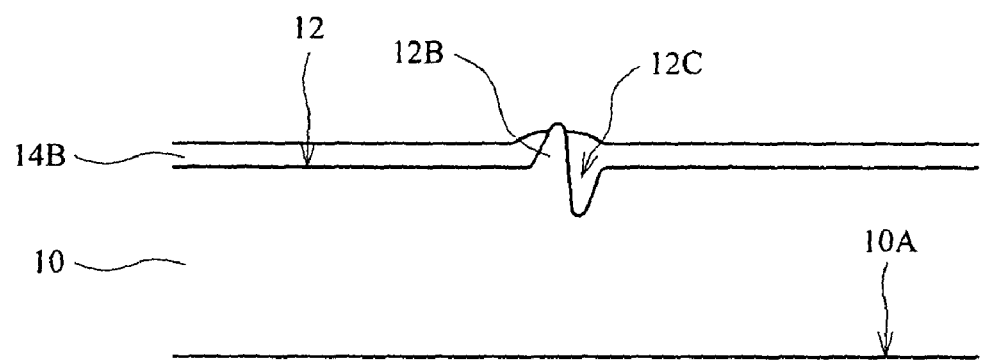

Referring to FIG. 1D, a photoresist dry etchback process is then carried out to etchback the second photoresist layer 14B, for example using an oxygen based dry etching chemistry. The photoresist etchback process is carried out for either for a timed period or to end-point detection preferably to expose a portion of the PMD layer, for example a protruding portion of PMD layer 12B.

Figure 1E:
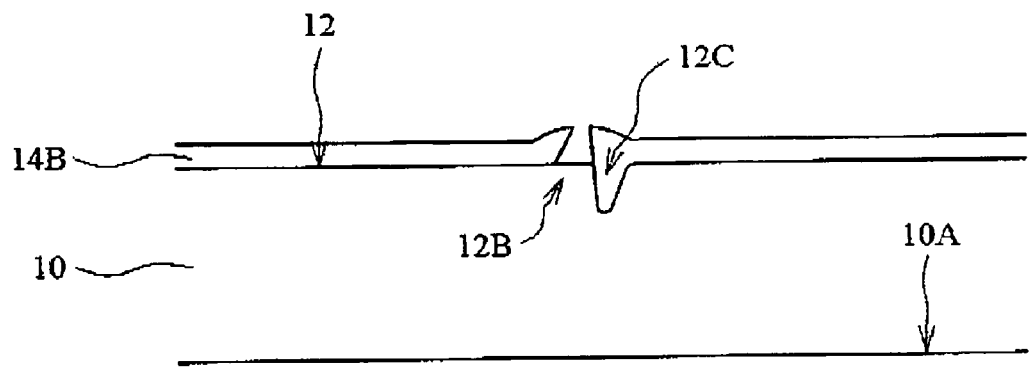

Referring to FIG. 1E, in an important aspect of the invention, an isotropic etch process is then carried out, for example a wet etch using dilute or buffered HF or a low power (500 W~900 W) dry etch using NF3, CF4 and O2 to isotropically etch the protruding portion of PMD layer 12B to about the planarization level e.g., planar portion of the PMD surface 12. It will be appreciated that any isotropic etch process that selectively etches the PMD layer 10 with respect to the second photoresist layer 14B may be used.

Figure 1F:
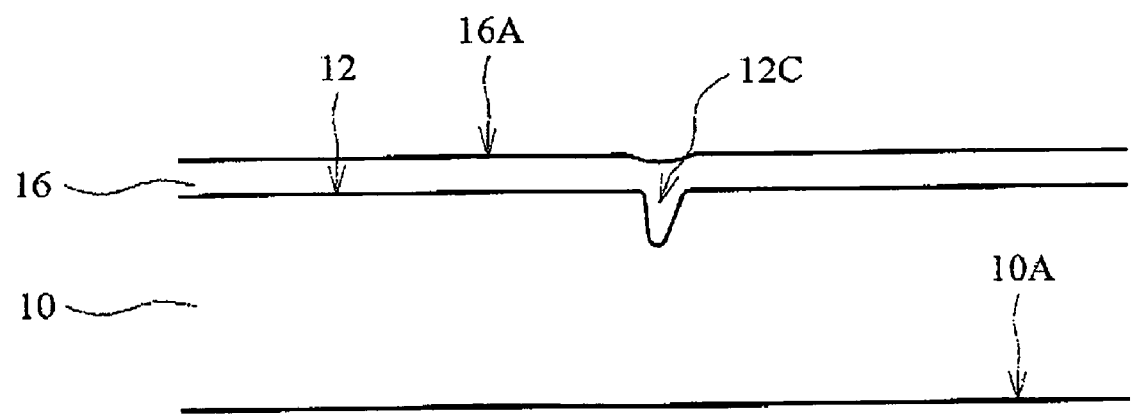

Referring to FIG. 1F, in another important aspect of the invention, the second photoresist layer 14B is then stripped and a second PMD layer portion 16, either the same or different preferred materials as the first PMD layer 10, preferably BPSG, is then deposited preferably having a thickness equal or greater than a depth of depression area 12C. An annealing process is then carried out at appropriate reflow temperatures (e.g., above a glass transition temperature $T_g$), for example from about 750° C. to about 900° C. in a steam and/or $N_2$ ambient to cause the first and second PMD layers including layer 16 to flow (reflow) to increase a surface planarity of both first PMD layer portion 10 and second PMD layer portion 16. A second PMD layer dry etchback process is then carried out to planarize the surface e.g., 16A of PMD layer 16.

Subsequent conventional processes are then carried out, for example forming metal filled electrical contacts to CMOS devices by forming damascenes through the PMD layer.

Figure 2:
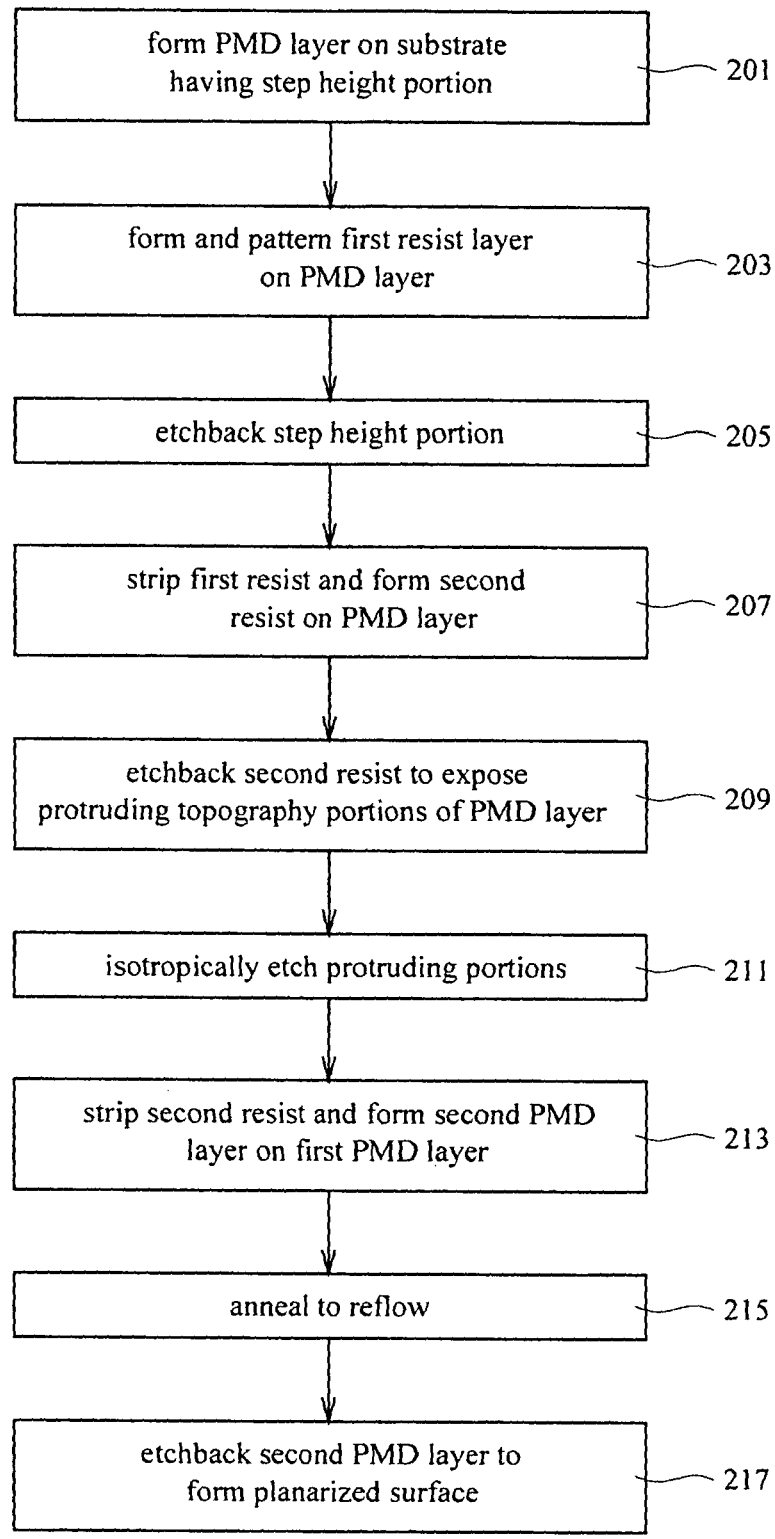
FIG. 2 is a process flow diagram including several embodiments of the present invention.

In FIG. 2 is shown a process flow diagram including several embodiments of the present invention. In process 201, a first PMD layer is provided on a substrate having a step height topography portion. In process 203, a first photoresist layer is deposited and patterned to expose a step height topography portion. In process 205, the step height topography portion is etched back to a planarization level. In process 207, the first photoresist layer is stripped and a second photoresist layer formed on the first PMD layer. In process 209, the second photoresist layer is etched back to partially expose protruding topography portions of the first PMD layer. In process 211, the protruding topography portions are isotropically etched to about the planarization level. In process 213, the second photoresist layer is stripped and a second PMD layer is formed on the first PMD layer. In process 215, at least the second PMD layer is annealed to reflow. In process 217, the second PMD layer is etched back in a dry etching process to planarize the second PMD layer surface.

Thus, a method has been presented for planarizing a dielectric layer including first and second dielectric layers where at least the second (uppermost) dielectric layer is flowable to achieve an acceptably planar surface, for example a PMD layer surface having step height portions greater than about 0.5 microns, for example about 1 micron or larger. Advantageously, a planarized surface may be cost effectively achieved without the necessity of extended CMP processes. Advantageously, the method of planarization according to the present invention avoids the problems exhibited in prior art etchback planarization processes where depressed areas are left at the surface leading to the formation of metal stringers from subsequent metal backfilling processes, for example to form metal filled contacts.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of planarizing a dielectric insulating layer comprising the steps of:
   providing a substrate;
   forming a first dielectric insulating layer on the substrate, said first dielectric insulating layer having a concave and convex portion on an upper surface of said first dielectric insulating layer adjacent a substantially planar portion on said upper surface defining a planarization level on said upper surface;
   forming an organic resinous layer on the first dielectric insulating layer having a thickness sufficient to cover the convex portion and exposing the convex portion using a dry etching chemistry without using a CMP process, said exposed convex portion protruding through an upper surface of said organic resinous layer;
   isotropically etching the convex portion to be about co-planar with said planarization level following said exposing the convex portion using a dry etching chemistry;
   removing the organic resinous layer; and,
   forming a second dielectric insulating layer on the first dielectric insulating layer including said isotropically etched convex portion.

2. The method of claim 1, wherein the first and second dielectric insulating layers are flowable at a glass transition temperature.

3. The method of claim 1, wherein the first and second dielectric insulating layers are selected from the group consisting of PSG, BPSG, and BPTEOS.

4. The method of claim 1, wherein the organic resinous layer comprises a photoresist.

5. The method of claim 1, wherein the first and second dielectric insulating layers comprise a pre-metal dielectric (PMD) layer.

6. The method of claim 1, further comprising the steps of:
   carrying out an annealing process to cause at least the second dielectric insulating layer to reflow; and,
   etching back the second dielectric insulating layer to approach a surface planarity.

7. A method of planarizing a dielectric insulating layer comprising the steps of:
   providing a substrate;
   forming a first dielectric insulating layer on the substrate, said first dielectric insulating layer having a concave and convex portion on an upper surface of said first dielectric insulating layer adjacent a substantially planar portion on said upper surface defining a planarization level on said upper surface;

forming an organic resinous layer on the first dielectric insulating layer having a thickness sufficient to cover the convex portion and exposing the convex portion using a dry etching chemistry without using a CMP process, said exposed convex portion protruding through an upper surface of said organic resinous layer;

isotropically etching the convex portion to be about co-planar with said planarization level following said exposing the convex portion using a dry etching chemistry;

removing the organic resinous layer; and, forming a second dielectric insulating layer on the first dielectric insulating layer;

carrying out an annealing process to cause at least the second dielectric insulating layer to reflow; and, etching back the second dielectric insulating layer to approach a surface planarity.

8. The method of claim 7, wherein the first and second dielectric insulating layers are flowable at a glass transition temperature.

9. The method of claim 7, wherein the first and second dielectric insulating layers are selected from the group consisting of PSG, BPSG, and BPTEOS.

10. The method of claim 7, wherein the organic resinous layer comprises a photoresist.

11. The method of claim 7, wherein the first and second dielectric insulating layers comprise a pre-metal dielectric (PMD) layer.

12. A method of planarizing a PMD layer comprising the steps of:

providing a substrate;

forming a first PMD layer on the substrate having an upper surface with a substantially planar upper surface portion defining a planarization level and a step height topography portion adjacent said upper surface portion, said step height topography portion having a step height above said planarization level on the first PMD layer upper surface about equal to the thickness of the first PMD layer;

forming and patterning a photoresist layer on the first PMD layer;

etching back the step height topography portion to approach said planarization level;

forming an organic resinous layer on the first PMD layer;

etching back the organic resinous layer to expose first PMD layer portions, said exposed first PMD layer portions protruding through an upper surface of said organic resinous layer;

isotropically etching the first PMD layer portions to be about co-planar with said planarization level;

removing the organic resinous layer;

forming a second PMD layer on the first PMD layer including said isotropically etched portions;

carrying out an annealing process to cause the first and second PMD layers to reflow; and, etching back the second PMD layer to approach a surface planarity.

13. The method of claim 12, wherein the first and second PMD layers are selected from the group consisting of PSG, BPSG, and BPTEOS.

14. The method of claim 12, wherein the first and second PMD layers consist essentially of BPSG.

15. The method of claim 12, wherein the isotropic etching process comprises an HF containing wet etching process.

16. The method of claim 12, wherein the step height portion is greater than about 0.5 microns.

17. The method of claim 12, wherein the step height portion is greater than about 1 micron.

18. The method of claim 12, wherein the organic resinous layer comprises a photoresist.

19. The method of claim 12, wherein carrying out the annealing process comprises an ambient component selected from the group consisting of $H_2O$ and $N_2$.

20. The method of claim 12, wherein the step of etching back the step height topography portion produces depressed areas of surface topography adjacent protruding areas of the surface topography.

* * * * *